United States Patent
Tomiyama et al.

(10) Patent No.: US 8,898,874 B2
(45) Date of Patent: Dec. 2, 2014

(54) METHOD OF FABRICATING A PIEZOELECTRIC VIBRATING PIECE

(75) Inventors: Mitsuo Tomiyama, Chiba (JP); Takashi Kobayashi, Chiba (JP); Kazuyoshi Sugama, Chiba (JP)

(73) Assignee: SII Crystal Technology Inc., Chiba (JP)

( * ) Notice: Subject to any disclaimer, the term of this patent is extended or adjusted under 35 U.S.C. 154(b) by 1232 days.

(21) Appl. No.: 12/372,251

(22) Filed: Feb. 17, 2009

(65) Prior Publication Data

US 2009/0205183 A1    Aug. 20, 2009

(30) Foreign Application Priority Data

Feb. 19, 2008 (JP) .................................. 2008-037031

(51) Int. Cl.
| | |
|---|---|
| H03H 3/02 | (2006.01) |
| H03H 9/15 | (2006.01) |
| H03H 9/05 | (2006.01) |
| H03H 9/10 | (2006.01) |
| H03H 9/21 | (2006.01) |
| C30B 29/18 | (2006.01) |
| C30B 33/08 | (2006.01) |

(52) U.S. Cl.
CPC ............... *H03H 3/02* (2013.01); *H03H 9/0542* (2013.01); *H03H 9/1021* (2013.01); *H03H 9/21* (2013.01); *C30B 29/18* (2013.01); *C30B 33/08* (2013.01); *H03H 2003/026* (2013.01)
USPC ............. 29/25.35; 29/594; 29/846; 29/847; 216/41; 216/44; 310/361; 310/365; 310/367; 310/370

(58) Field of Classification Search
CPC ......... H03H 3/02; H03H 9/0542; H03H 9/21; H03H 9/1021; H03H 2003/026; C30B 29/18; C30B 33/08
USPC ............. 29/29.35, 594, 847, 25.35, 842, 846, 29/896.22; 216/41, 44; 310/361, 365–367, 310/370

See application file for complete search history.

(56) References Cited

U.S. PATENT DOCUMENTS

| | | | | | |
|---|---|---|---|---|---|
| 4,173,726 | A | * | 11/1979 | Hanji | .............................. 310/366 |
| 7,138,288 | B2 | * | 11/2006 | Shioji et al. | ............... 29/25.35 X |
| 2006/0175288 | A1 | * | 8/2006 | Aratake | ......................... 216/41 |
| 2008/0000058 | A1 | * | 1/2008 | Takahashi | .................... 29/25.35 |

FOREIGN PATENT DOCUMENTS

| | | | |
|---|---|---|---|
| JP | 05-315881 | A1 | 11/1993 |
| JP | 2001208546 | A * | 8/2001 |

\* cited by examiner

*Primary Examiner* — A. Dexter Tugbang
(74) *Attorney, Agent, or Firm* — Brinks Gilson & Lione

(57) ABSTRACT

To fabricate a plurality of piezoelectric vibrating pieces while firmly preventing a defect, a crack, or a breakage from being brought about at a wafer in the midst of fabrication, there is provided a method of fabricating a piezoelectric vibrating piece which is a method of fabricating a plurality of piezoelectric vibrating pieces from a wafer S, the method including a film forming step of respectively forming metal films M on both faces of the wafer, a patterning step of removing a region of the metal film on an inner side of an outer peripheral end of the wafer by a constant distance H, thereafter, patterning the metal film M to outer shapes of the plurality of piezoelectric vibrating pieces, an outer shape forming step of forming outer shapes of the plurality of piezoelectric vibrating pieces at the wafer a size of which is reduced by an amount of the constant distance by selectively removing the wafer by wet etching by constituting a mask by the patterned metal film, and a removing step of removing the metal film.

2 Claims, 18 Drawing Sheets

METHOD OF FABRICATING A PIEZOELECTRIC VIBRATING PIECE

RELATED APPLICATIONS

This application claims priority under 35 U.S.C. §119 to Japanese Patent Application No. JP2008-037031 filed on Feb. 19, 2008, the entire content of which is hereby incorporated by reference.

FIELD OF THE INVENTION

The present invention relates to a method of fabricating a piezoelectric vibrating piece for fabricating a plurality of piezoelectric vibrating pieces by working a wafer by etching, a piezoelectric vibrating piece fabricated by the fabricating method, a piezoelectric vibrator having the piezoelectric vibrating piece, an oscillator, an electronic apparatus and a radiowave timepiece having the piezoelectric vibrator.

DESCRIPTION OF THE RELATED ART

In recent years, a portable telephone or a portable information terminal apparatus uses a piezoelectric vibrator utilizing quartz or the like as a time source, a timing source of a control signal or the like or a reference signal source or the like. As a piezoelectric vibrator of this kind, various ones are known, for example, as shown by FIG. 22, there is known a piezoelectric vibrating piece 200 of a tuning fork type constituted by a pair of vibrating arm portions 201 and a base portion 202 integrally fixing base end sides of the pair of vibrating arm portions 201. Further, otherwise, also a thickness slipping vibrating piece or the like for carrying out a thickness slipping vibration is known.

Meanwhile, according to the piezoelectric vibrating piece of this kind, generally, a plurality thereof are fabricated at a time by working a wafer of quartz or the like by etching by utilizing a photolithography technology and an etching technology (refer to, for example, JP-A-5-315881). Here, a case of fabricating the piezoelectric vibrating piece 200 of the tuning fork type shown in FIG. 22 by the fabricating method will simply be explained in reference to the drawing.

First, as shown by FIG. 23, a metal film M constituting an etching mask is formed on one face S1 of a wafer S cut from a raw stone by a predetermined angle, thereafter, polished to a predetermined thickness by a vapor deposition method or the like. Further, as the metal film M, for example, a laminated film of being laminated by chromium (Cr) and gold (Au) is used. Meanwhile, in forming the film, normally, the metal film M is formed not only at one face S1 of the wafer S but a side face of the wafer S by turning around the side face.

Successively, after making the wafer S upside down, as shown by FIG. 24, the metal film M is similarly formed also at other face S2 of the wafer S. Further, in FIG. 24, a direction of the wafer S is illustrated in a state the same as that of FIG. 23. Therefore, the side face of the wafer S is brought into a state of being laminated with the metal film M.

Successively, as shown by FIG. 25, a photoresist film F is coated over a total thereof. Further, as shown by FIG. 26 and FIG. 27, by exposing and developing the photoresist film F, patterning is carried out to an outer shape of the piezoelectric vibrating piece 200. Further, FIG. 27 through FIG. 30 are sectional views taken along a cut line D-D shown in FIG. 26. At this occasion, a plurality of outer shapes of the piezoelectric vibrating piece 200 are patterned.

Successively, as shown by FIG. 28, the metal film M is worked to etch by constituting a mask by the patterned photoresist film F, and a portion which is not masked is selectively removed. Thereby, the metal film M can be patterned to the outer shape of the piezoelectric vibrating piece 200. Thereafter, as shown by FIG. 29, the photoresist film F is removed.

Successively, as shown by FIG. 30, the wafer S is worked by wet etching utilizing a predetermined etching solution by constituting a mask by the patterned metal film M to selectively remove the portion which is not masked. Further, by removing the metal film M, the wafer S can be formed to the outer shapes of the plurality of piezoelectric vibrating pieces 200, that is, outer shapes of the pairs of vibrating arm portions 201 and the base portions 202.

Thereafter, after forming electrode films to the plurality of piezoelectric vibrating pieces 200 formed with the outer shapes, by carrying out cutting of cutting to separate from the wafer S, the plurality of piezoelectric vibrating pieces 200 can be fabricated at a time from the single wafer S.

However, according to the above-described related art method, the following problem still remains.

When the metal film M is formed at the wafer S, in a case of either face of the wafer S (one face S1 or other face S2), the metal film M is formed at the side face of the wafer S by turning around as described above. However, at this occasion, a portion of the metal film M is turned around not only to the side face but also to the face on the opposed side. That is, when the metal film M is formed at the one face S1 of the wafer S, as shown by FIG. 23, a portion of the metal film M is turned around to the side of the other face S2. Further, similarly, also in a case of forming the metal film M at other face S2 of the wafer S, as shown by FIG. 24, a portion of the metal film M is invariably turned around to the side of the one face S1 of the wafer S.

The metal films M bear an important roll of constituting the masks in wet etching of the wafer S, and it is necessary to form the metal film M in a state of being brought into close contact with the wafer S solidly. However, according to a portion of the metal film M turned around to the metal film M formed at the side face of the wafer S or the face on the opposed side, a performance of being brought into close contact with the wafer S is poor by an influence of turning around or the like to be brought into a porous state. Therefore, a function as the mask cannot be achieved, and in wet etching, the etching solution is permitted to invade an interface of the metal film M and the wafer S. As a result, a problem of roughening an outer peripheral portion of the wafer S is posed. Therefore, a defect or a crack is brought about at the wafer S from the roughened portion and in the worst case, there is a possibility of bringing about a breakage.

SUMMARY OF THE INVENTION

The invention has been carried out in consideration of such a situation, and it is an object thereof to provide a method of fabricating a piezoelectric vibrating piece capable of fabricating a plurality of piezoelectric vibrating pieces while firmly preventing a defect, a crack, a breakage from being brought about at a wafer in the midst of fabrication, a piezoelectric vibrating piece fabricated by the fabricating method, a piezoelectric vibrator having the piezoelectric vibrating piece, further, an oscillator, an electronic apparatus and a radiowave timepiece having a piezoelectric vibrator.

The invention provides the following means in order to resolve the problem.

A method of fabricating a piezoelectric vibrating piece according to the invention is a method of fabricating a plurality of piezoelectric vibrating pieces from wafer, the method comprising a film forming step of forming metal films respectively on both faces of the wafer, a patterning step of removing a region of the metal film on an inner side of an outer peripheral end of the wafer by a constant distance over an entire periphery thereof, thereafter, patterning the metal film to an outer shape of the plurality of piezoelectric vibrating pieces, an outer shape forming step of forming outer shapes of the plurality of piezoelectric vibrating pieces at the wafer a size of which is reduced by an amount of the constant distance by selectively removing the wafer by wet etching by constituting a mask by the patterned metal film, and a removing step of removing the metal film.

In the method of fabricating a piezoelectric vibrating piece according to the invention, first, there is carried out a film forming step of respectively forming metal films on both faces of a wafer by successively forming the metal films constituting masks in etching at one face and other face of the wafer. Meanwhile, when the metal film is formed on one face of the wafer, the metal film is turned around to a side face and a side of the other face of the wafer similar to the background art. Further, also when the metal film is formed on the other face of the wafer, the metal film is turned around to the side face and a side of the one face of the wafer.

Successively, there is carried out a patterning step of patterning the metal films formed on the both faces of the wafer to outer shapes of a plurality of the piezoelectric vibrating pieces by a photolithography technology. Particularly, when the step is carried out, the patterning is carried out after removing a region of the formed metal film on an inner side of an outer peripheral edge of the wafer by a predetermined distance over an entire periphery thereof. Thereby, a portion of the metal film turned around to the side face and the side of the face on the opposed side of the wafer in the film forming step can be removed before carrying out etching of the wafer. That is, a portion of the formed metal film which is poor in adherence to the wafer by an influence of turning around and becomes porous can completely be removed.

Therefore, the wafer is brought into a state of exposing the region on the inner side of the outer peripheral end by the constant distance over the entire periphery.

Successively, there is carried out an outer shape forming step of selectively removing the portion which is not masked by subjecting the wafer to wet etching by constituting a mask by the patterned metal film. Thereby, the outer shapes of the plurality of piezoelectric vibrating pieces can be formed at the wafer a size of which is reduced by an amount of the constant distance. Further, finally, after carrying out a removing step of removing the metal film utilized as the mask, the plurality of piezoelectric vibrating pieces can be provided from the single wafer by cutting to separate the piezoelectric vibrating pieces from the wafer.

Particularly, when etching is carried out, the metal film having the poor adherence to the wafer is removed, and therefore, there is not a concern of roughening a surface of the wafer by making an etching solution used in wet etching invade the interface of the metal film and the wafer as in the background art. As a result, it can be prevented that a defect or a crack is brought about or a breakage is brought about at the wafer in the midst of fabrication. Therefore, the piezoelectric vibrating piece can be fabricated efficiently without interrupting the operation in the midst of fabrication, which amounts to low cost formation, further, the high quality piezoelectric vibrating piece can be fabricated.

Further, in the method of fabricating a piezoelectric vibrating piece according to the invention, the constant distance is set to a distance in a range equal to or larger than 0.3 mm and equal to or smaller than 0.5 mm.

In the method of fabricating a piezoelectric vibrating piece according to the invention, the region of the formed metal film on the inner side of the outer peripheral end of the wafer by at least 0.3 mm or more is removed over the entire periphery, and therefore, the portion of the wafer having the poor adherence and turned around to the side face and the face on the opposed side of the wafer can firmly be removed. Therefore, in the wet etching, it can firmly be prevented that the surface of the wafer is roughened.

Further, the region of removing the wafer is restrained within the range of 0.5 mm, and therefore, a reduction of the size of the wafer can be minimized. Therefore, the wafer can be used without waste and a number of pieces of taking out the piezoelectric vibrating pieces can be ensured to be as large as possible.

Further, a piezoelectric vibrating piece according to the invention is fabricated by the method of fabricating a piezoelectric vibrating piece according to the invention.

The piezoelectric vibrating piece according to the invention is fabricated by the above-described fabricating method, and therefore, low cost formation and high quality formation can be achieved.

Further, a piezoelectric vibrator according to the invention includes the piezoelectric vibrating piece of the invention.

The piezoelectric vibrator according to the invention includes the above-described piezoelectric vibrating piece, and therefore, low cost formation and high quality formation can similarly be achieved. The piezoelectric vibrator is, for example, a piezoelectric vibrator of a cylinder package type or a piezoelectric vibrator of a ceramic package type of a box type.

In an oscillator according to the invention, the piezoelectric vibrator of the invention is electrically connected to an integrated circuit as an oscillating piece.

Further, in an electronic apparatus according to the invention, the piezoelectric vibrator of the invention is electrically connected to a time counting portion.

Further, in a radiowave timepiece according to the invention, the piezoelectric vibrator of the invention is electrically connected to a filter portion.

The oscillator, the electronic apparatus and the radiowave timepiece according to the invention include the above-described piezoelectric vibrator, and therefore, and therefore, low cost formation and high quality formation can similarly be achieved.

In the method of fabricating a piezoelectric vibrating piece according to the invention, the plurality of piezoelectric vibrating piece can efficiently be fabricated while firmly preventing a defect, a crack, or a breakage from being brought about at the wafer in the midst of fabrication. The piezoelectric vibrating piece according to the invention is fabricated by the above-described fabricating method, and therefore, low cost formation and high quality formation can be achieved.

Further, the piezoelectric vibrator, the oscillator, the electronic apparatus of the radiowave timepiece according to the invention include the above-described piezoelectric vibrating piece, and therefore, low cost formation and high quality formation can similarly be achieved.

BRIEF DESCRIPTION OF THE DRAWINGS

FIG. 6A is a view showing the wafer in a rectangular shape, and FIG. 6B is a view showing the wafer in a circular shape.

FIG. 15A shows a case of the wafer in a rectangular shape, and FIG. 15B is a view showing a case of the wafer in a circular shape;

DETAILED DESCRIPTION OF THE PREFERRED EMBODIMENTS

An embodiment of a piezoelectric vibrating piece and a method of fabricating the piezoelectric vibrating piece according to the invention will be explained in reference to FIG. 1 through FIG. 15. Further, according to the embodiment, as an example of a piezoelectric vibrating piece, an explanation will be given by taking an example of a piezoelectric vibrating piece 1 of a tuning fork type.

Figure 1:
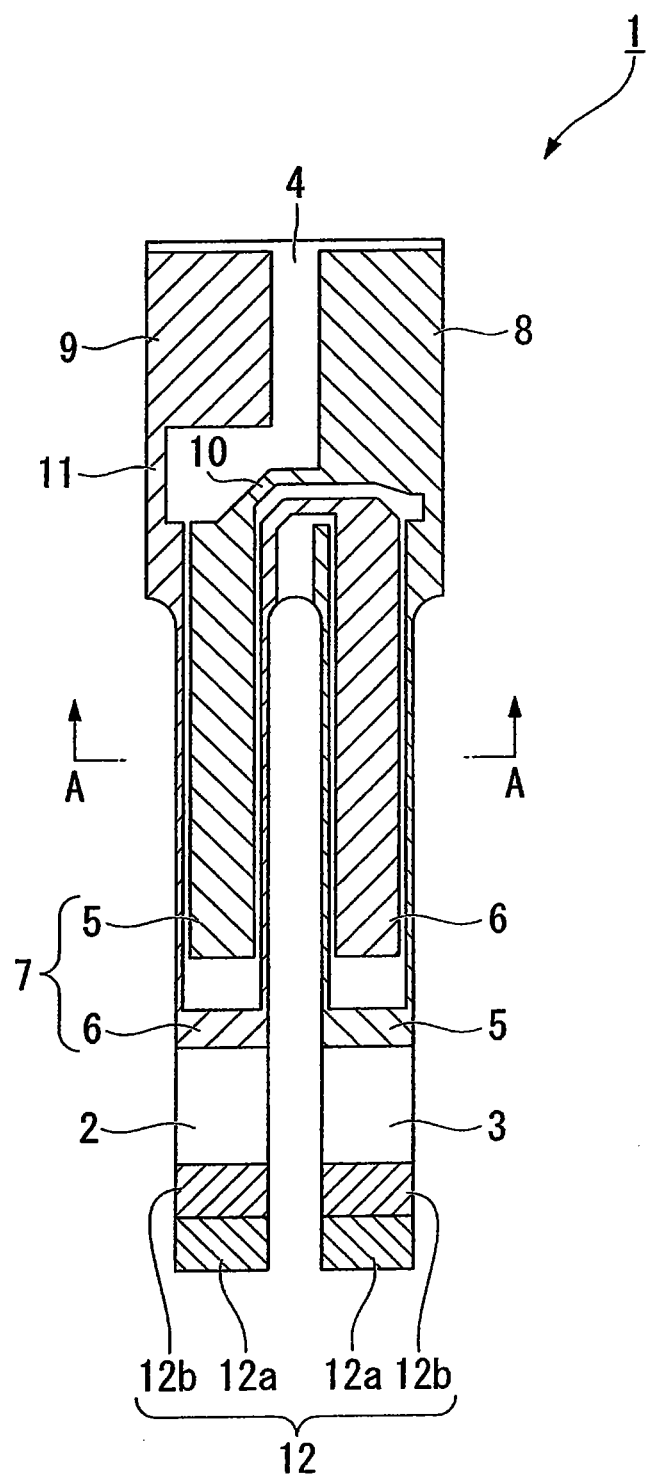
FIG. 1 is a view showing an embodiment of a piezoelectric vibrating piece according to the invention and is a view showing the piezoelectric vibrating piece from an upper face thereof.
Figure 2:
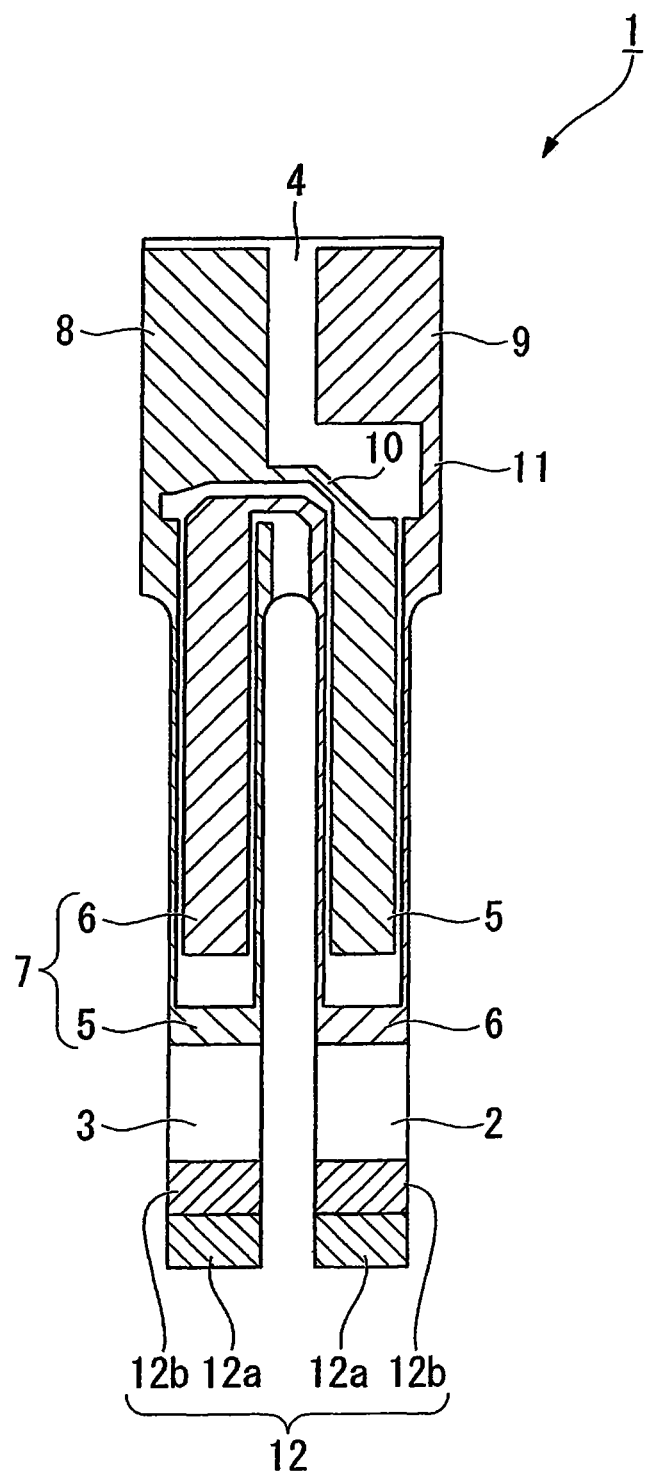
FIG. 2 is a view viewing the piezoelectric vibrating piece shown in FIG. 1 from a lower face thereof.

As shown by FIG. 1 and FIG. 2, the piezoelectric vibrating piece 1 of the embodiment includes a pair of vibrating arm portions 2, 3 arranged in parallel, a base portion 4 integrally fixing base end sides of the pair of vibrating arm portions 2, 3, an exciting electrode 7 constituted by a first exciting electrode 5 and a second exciting electrode 6 formed on outer surfaces of the pair of vibrating arm portions 2, 3 for vibrating the pair of vibrating arm portions 2, 3, and mount electrodes 8, 9 respectively electrically connected to the two exciting electrodes 5, 6.

Figure 3:
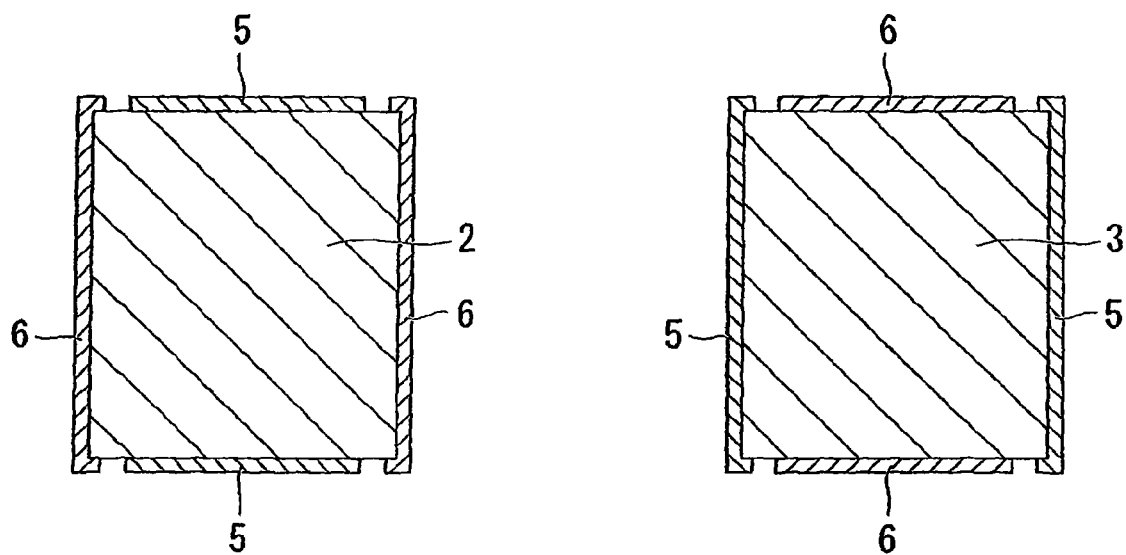
FIG. 3 is a sectional view taken along a cut line A-A of FIG. 1.

The exciting electrode 7 constituted by the first exciting electrode 5 and the second exciting electrode 6 is an electrode for vibrating the pair of vibrating arm portions 2, 3 in directions of being proximate to or remote from each other by a predetermined resonance frequency, and is formed by being patterned on the outer surfaces of the pair of vibrating arm portions 2, 3 in a state of respectively electrically cut to be separated. Specifically, as shown by FIG. 3, the first exciting electrodes 5 are formed mainly on two faces of the one vibrating arm portion 2 and on two side faces of the other vibrating arm portion 3, and the second exciting electrodes 6 are formed mainly on two side faces of the one vibrating arm portion 2 and on two faces of the other vibrating arm portion 3.

Further, as shown by FIG. 1 and FIG. 2, the first exciting electrode 5 and the second exciting electrode 6 are electrically connected to the mount electrodes 8, 9 respectively on both faces at the base portion 4 by way of leadout electrodes 10, 11. Further, the piezoelectric vibrating piece 1 is applied with a voltage by way of the mount electrodes 8, 9.

Further, the exciting electrode 7, the leadout electrodes 10, 11 and the mount electrodes 8, 9 are, for example, laminated films of chromium (Cr) and gold (Au) and applied with a gold thin film on the surface after forming a chromium film having an excellent adherence to quartz as a matrix. However, the invention is not limited to the case but, for example, a gold thin film may further be laminated to a surface of a laminated film of chromium and nichrome (NiCr), or a single layer film of chromium, nickel, aluminum (Al), titanium (Ti) or the like will do.

Further, front ends of the pair of vibrating arm portions 2, 3 are coated with weight metal films 12 for adjusting (adjusting frequency) a state of vibrating the vibrating arm portions 2, 3 per se within a range of a predetermined frequency. Further, the weight metal film 12 is divided into a rough adjusting film 12a used in roughly adjusting the frequency, and a fine adjusting film 12b used in adjusting the frequency finely. By adjusting the frequency by utilizing the rough adjusting film 12a and the fine adjusting film 12b, the frequency of the pair of vibrating arm portions 2, 3 can be confined within a range of a nominal frequency of a device.

When the piezoelectric vibrating piece 1 constituted in this way is operated, a predetermined voltage is applied to the mount electrodes 8, 9. Thereby, a current can be made to flow to the exciting electrode 7 constituted by the first exciting electrode 5 and the second exciting electrode 6 by way of the readout electrodes 10, 11, and the pair of vibrating arm portions 2, 3 can be vibrated in directions of being proximate to and remote from each other by the predetermined frequency. Further, by utilizing the vibration of the pair of vibrating arm portions 2, 3, the vibration can be utilized as a timing source or a reference signal source or the like of a time source, a control signal.

Figure 4:
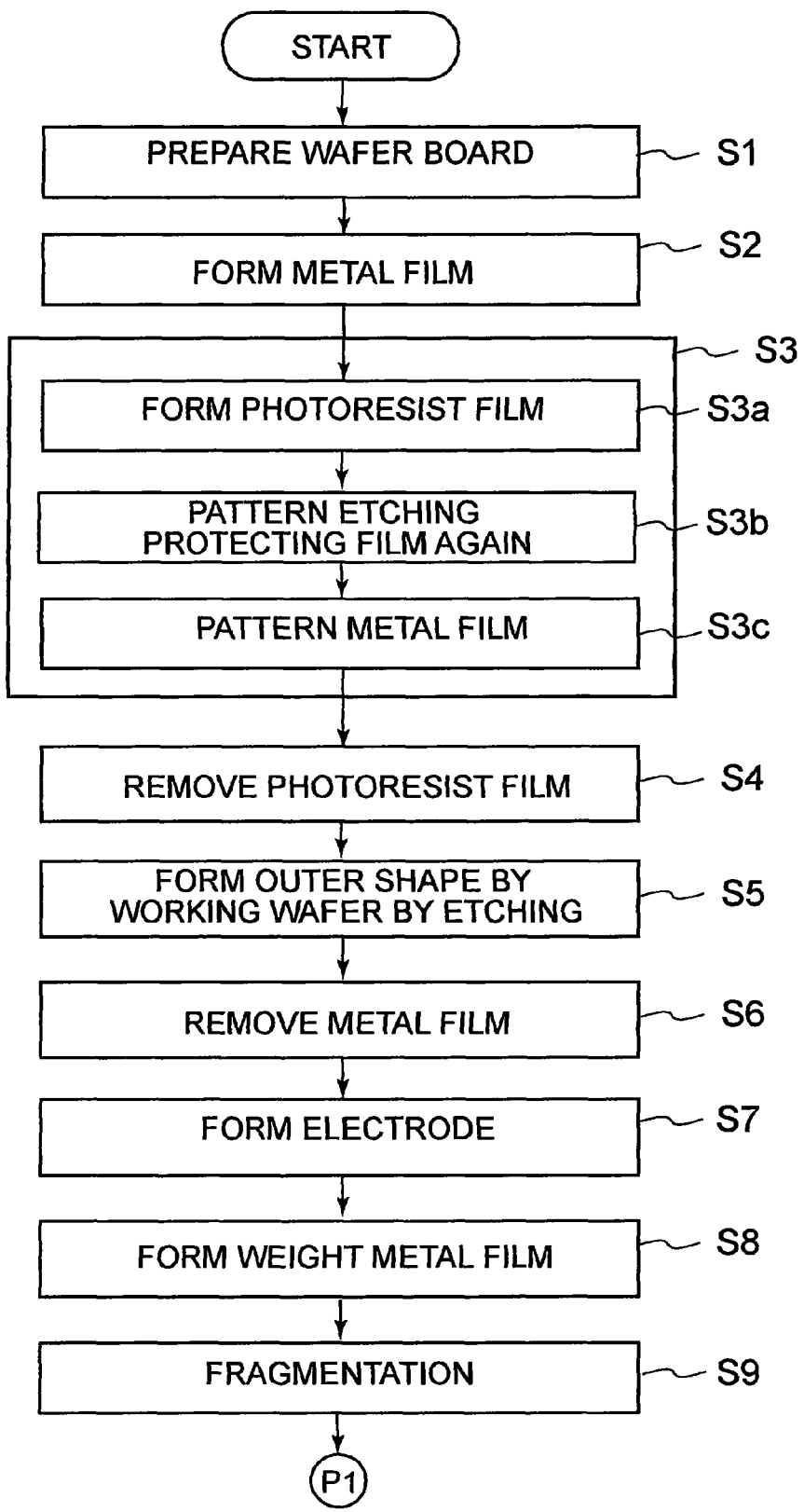
FIG. 4 is a flowchart of a method of fabricating the piezoelectric vibrating piece shown in FIG. 1.

Next, a method of fabricating the piezoelectric vibrating piece 1 described above will be explained as follows in reference to a flowchart shown in FIG. 4.

A fabricating method of the embodiment is a method of fabricating a plurality of the piezoelectric vibrating pieces 1 at a time from a single wafer S by carrying out a film forming step, a patterning step, an outer shape forming step, and a removing step in turn. The respective steps will be explained in details as follows.

Figure 5:
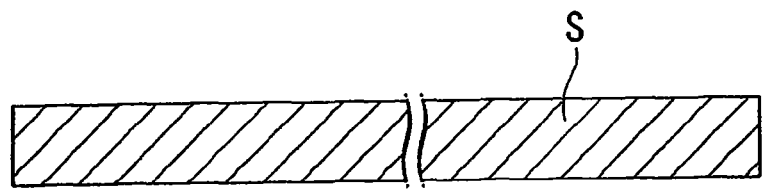
FIG. 5 is one step view in fabricating the piezoelectric vibrating piece shown in FIG. 1 and is a sectional view of a wafer.
Figure 6A:
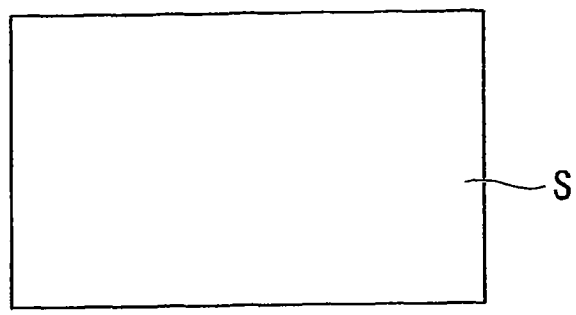
FIGS. 6A and 6B are views showing an example of the wafer shown in FIG. 5.
Figure 6B:
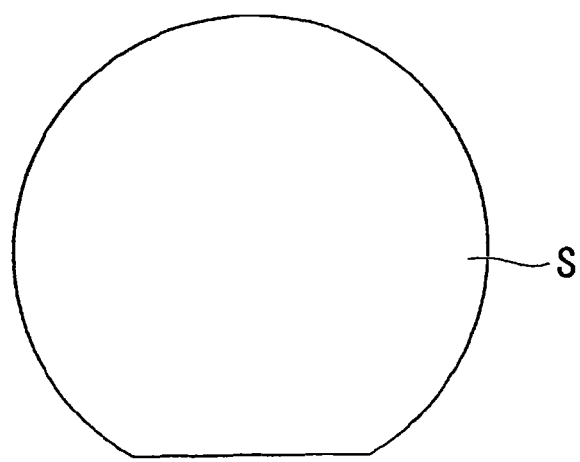

First, as shown by FIG. 5, a wafer S adjusted to a predetermined thickness by polishing both faces is prepared (S1). At this occasion, the wafer S may be the wafer S in a rectangular shape shown by FIG. 6A, or the wafer S in a circular shape as shown by FIG. 6B.

Next, a film forming step of forming respectively metal films M constituting masks in etching on the both faces of the wafer S is carried out (S2). Further, according to the embodiment, an explanation will be given by taking an example of a case of using a film laminated with chromium (Cr) and gold (Au) as the metal film M. However, a kind of the metal film M is not limited to such a combination but may freely be set. Further, a single layer film will do.

Here, the film forming step will be explained in details.

Figure 7:
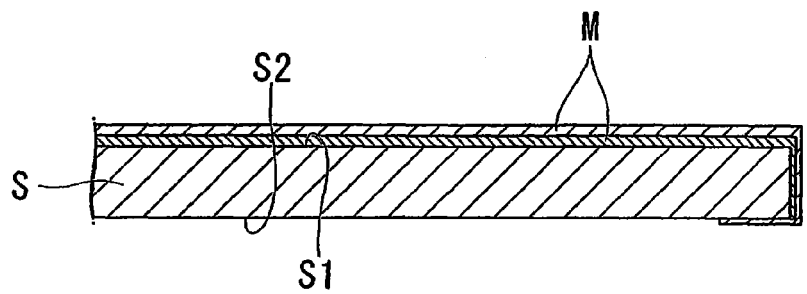
FIG. 7 is one step view in fabricating the piezoelectric vibrating piece shown in FIG. 1 and is a view showing a state of forming a metal film on one face of the wafer from a state shown in FIG. 5.
Figure 8:
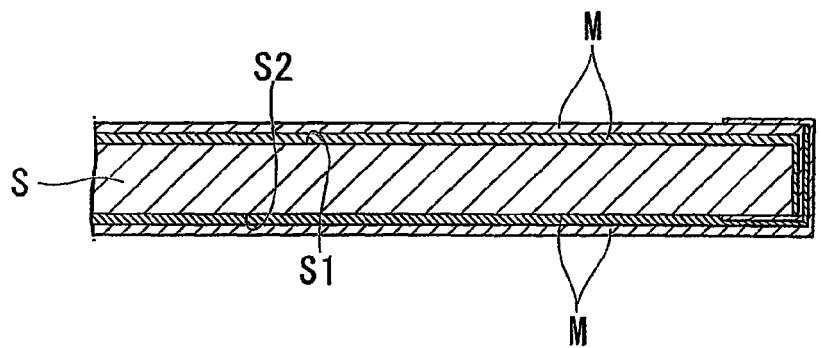
FIG. 8 is a view showing a state of forming a metal film on other face from a state shown in FIG. 7.

First, after setting the wafer S to a jig, not, illustrated, as shown by FIG. 7, first, the metal film M is formed on one face S1 by vapor deposition or the like. At this occasion, similar to the background art, a portion of the metal film M is turned around also to a side face and a side of other face S2 of the wafer S. Successively, by turning the wafer S upside down and setting the wafer S again to a jig, as shown by FIG. 8, the metal film M is formed similarly to other face S2 by vapor deposition or the like. Also at this occasion, similarly, a portion of the metal film M is turned around also to the side face and the side of one face S1 of the wafer S. Further, in FIG. 8, a direction of the wafer S is illustrated in a state the same as that of FIG. 7.

In this way, by carrying out film forming twice, the metal film M can be formed on the both faces of the wafer S. At the time point, the film forming step is finished. Particularly, as shown by FIG. 8, at a vicinity of an outer peripheral end of the wafer S, there is brought a state in which a number of layers of the metal film M overlap each other complicatedly by being influenced by the above-described turning around.

Figure 9:
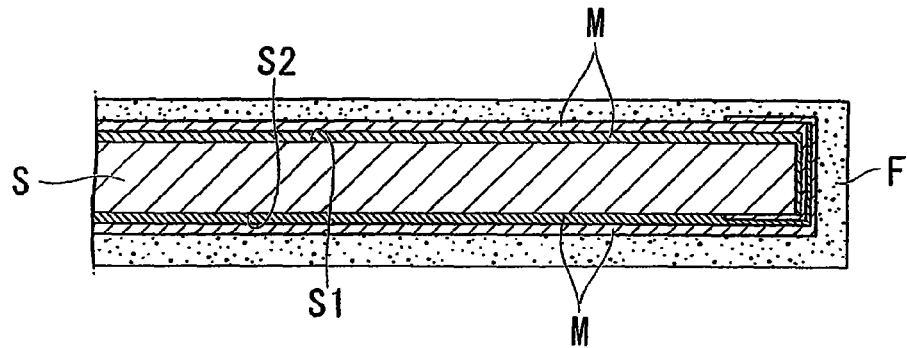
FIG. 9 is a view showing a state of coating a photoresist film over a total thereof from the state shown in FIG. 8.
Figure 10:
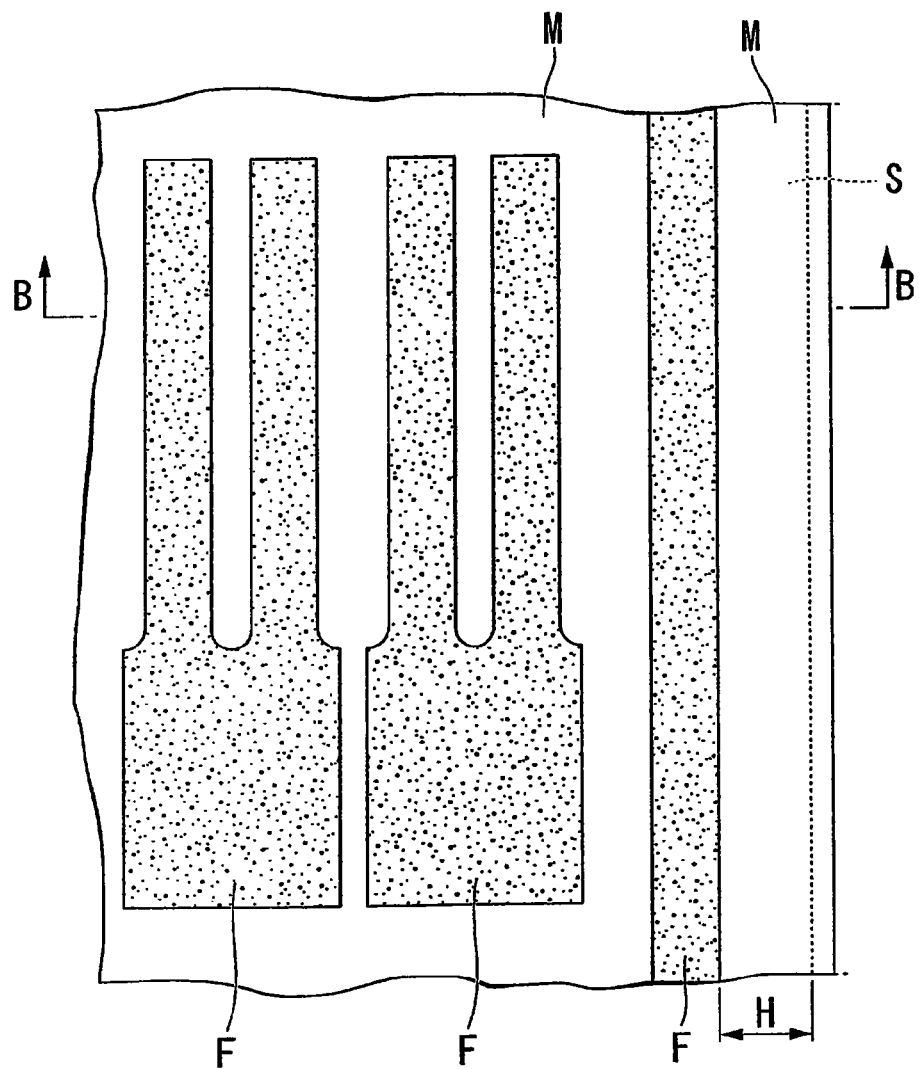
FIG. 10 is a view showing a state of patterning a photoresist film from the state shown in FIG. 9.
Figure 11:
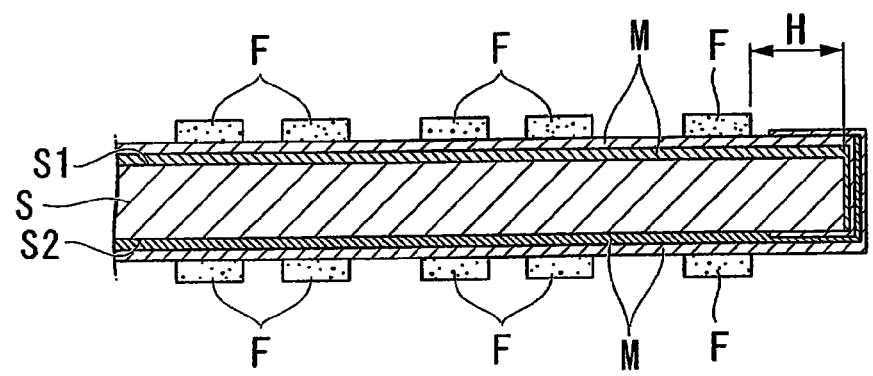
FIG. 11 is a sectional view taken along a cut line B-B show in FIG. 10.

Successively, there is carried out a patterning step of pattering the metal film M formed on the both faces of the wafer S into outer shapes of a plurality of the piezoelectric vibrating pieces 1 by photolithography technology (S3). The step will be explained in details. First, as shown by FIG. 9, the metal film M formed on the both faces of the wafer S is covered by a photoresist film F by coating the photoresist film F over a total thereof (S3a). Successively, the photoresist film F is exposed and developed, as shown by FIG. 10 and FIG. 11, after removing a region on an inner side of the outer peripheral end of the wafer S by constant distance H over an entire periphery of the wafer S, the patterning is carried out along an outer shape of the piezoelectric vibrating piece 1 (S3b). Further, FIG. 11 through FIG. 14 are sectional views taken along a line B-B shown in FIG. 10.

Figure 12:
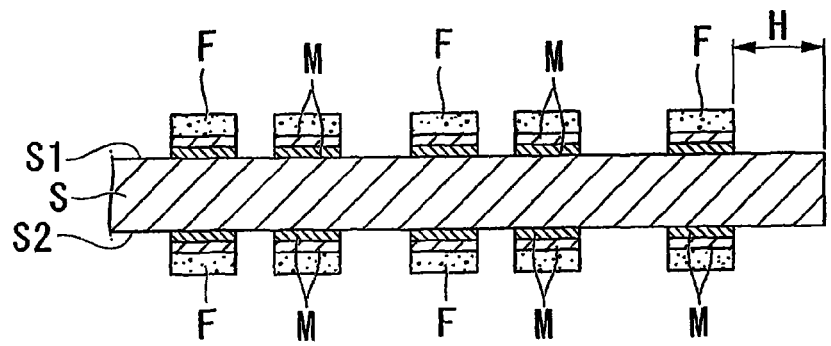
FIG. 12 is a view showing a state of patterning a metal film by constituting a mask by the photoresist film from a state shown in FIG. 11.

Successively, as shown by FIG. 12, by carrying out etching by constituting a mask by the patterned photoresist film F, the metal film M which is not masked is selectively removed, and the metal film M is patterned similar to the photoresist film F (S3c). Thereby, after removing the region of the metal film M formed on the both faces of the wafer S on the inner side of the outer peripheral end of the wafer S by the constant distance H over the entire periphery of the wafer S, patterning can be carried out along the outer shape of the piezoelectric vibrating piece 1, that is, along the outer shapes of the pair of vibrating arm portions 2, 3 and the base portion 4. At this occasion, the patterning is carried out by a number of the plurality of piezoelectric vibrating pieces 1.

Particularly, the region of the metal film M on the inner side of the outer peripheral end of the wafer S by the constant distance H is removed over an entire periphery of the wafer S, and therefore, a portion thereof turned around to the side face and the side of the face on the opposed side of the wafer S in the film forming step can previously be removed before etching the wafer S. That is, portions of the formed metal film M overlap each other complicatedly by a number of layers by the influence of the turning around can be removed. The portion is a portion which become porous owing to a poor adherence to the wafer S and such a rough portion as the mask can completely be removed.

At the time point, the patterning step is finished. Further, at a time point of finishing the step, the wafer S is brought into a state in which the region on the inner side of the outer peripheral end by the constant distance H is exposed over the entire periphery.

Figure 13:
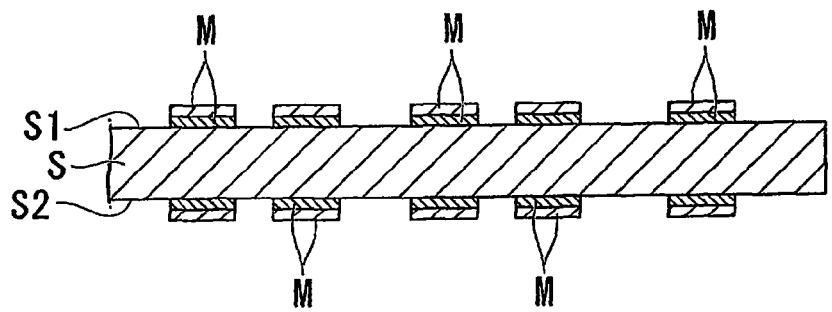
FIG. 13 is a view showing a state of removing the photoresist film from the state shown in FIG. 12.
Figure 14:
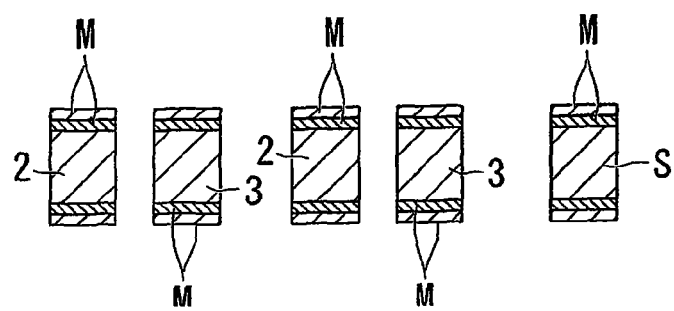
FIG. 14 is a view showing a state of working the wafer by etching by constituting a mask by the metal film from the state shown in FIG. 13.

Successively, the photoresist film F is removed as shown by FIG. 13 (S4). Further, as shown by FIG. 14, there is carried out an outer shape forming step of selectively removing a portion which is not masked by working the wafer S by wet etching by constituting a mask by the metal film M which is not masked (S5).

Figure 15A:
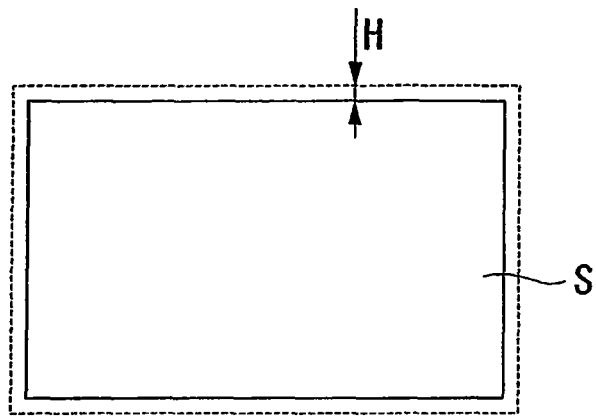
FIGS. 15A and 15B illustrate a total view of the wafer in a state shown in FIG. 14.
Figure 15B:
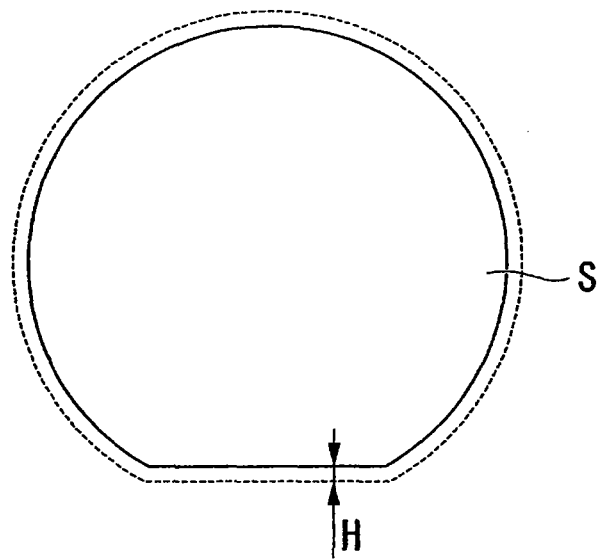

At a time point of carrying out the step, a size thereof becomes small by an amount of the constant distance H as shown by FIG. 15A or 15B. Further, outer shapes of the plurality of piezoelectric vibrating pieces 1, that is, outer shapes of pairs of vibrating arm portions 2, 3 and the base portion 4 can be formed at the wafer S the size of which becomes small. Further, at the time point, the plurality of piezoelectric vibrating pieces 1 are brought into a state of being connected to the wafer S by way of connecting portions, not illustrated.

Successively, a removing step of removing the metal film M constituting the mask is carried out (S6). There is carried out an electrode forming step of forming respectively the exciting electrodes 7, the leadout electrodes 10, 11, the mount electrodes 8, 9 by forming electrode films, not illustrated, an outer surfaces of the plurality of piezoelectric vibrating pieces 1 and carrying out pattering (S7). Further, the weight metal film 12 is formed by similar method simultaneously therewith (S8). Further, finally, there is carried out a cutting step of cutting to separate the plurality of piezoelectric vibrating pieces 1 from the wafer S by cutting the connecting portions to fragment (S9). Thereby, the plurality of piezoelectric vibrating pieces 1 can be fabricated at a time from the single wafer S.

Particularly, according to the fabricating method, the metal film M having the poor adherence to the wafer S is removed before carrying out etching, and therefore, there is not a concern of making an etching solution used in the wet etching invade an interface of the metal film M and the wafer S to roughen the surface of the wafer S. As a result, it can be prevented that a defect or a crack is brought about or a breakage is brought about at the wafer S in the midst of fabrication. Therefore, the piezoelectric vibrating piece 1 can be fabricated efficiently without interrupting the operation in the midst of fabrication, which amounts to low cost formation, further, the high quality piezoelectric vibrating piece 1 can be fabricated.

Further, in the above-described fabrication, it is preferable to set the constant distance H to a distance equal to or larger than 0.3 mm and equal to or smaller than 0.5 mm.

In this case, the region of the metal film M formed on the both faces of the wafer S on the inner side of the outer peripheral end of the wafer S by at least 0.3 mm or more is removed over the entire periphery of the wafer S, and therefore, the portion having poor adherence turned around the side face and the face on the other side of the wafer S can firmly be removed. Therefore, in the wet etching, the surface of the wafer S can firmly be prevented from being roughened.

Further, the region of removing the wafer S can be restrained within 0.5 mm from the outer peripheral end, and therefore, a reduction in the size of the wafer S can be minimized. Therefore, the wafer S can be used without waste and a number of pieces of taking the piezoelectric vibrating pieces 1 can be ensured to be as large as possible.

Next, an embodiment of the piezoelectric vibrator having the piezoelectric vibrating piece according to the invention will be explained in reference to FIG. 16. Further, according to the embodiment, the piezoelectric vibrator, an explanation will be given by taking an example of a piezoelectric vibrator of a cylinder package type.

Figure 16:
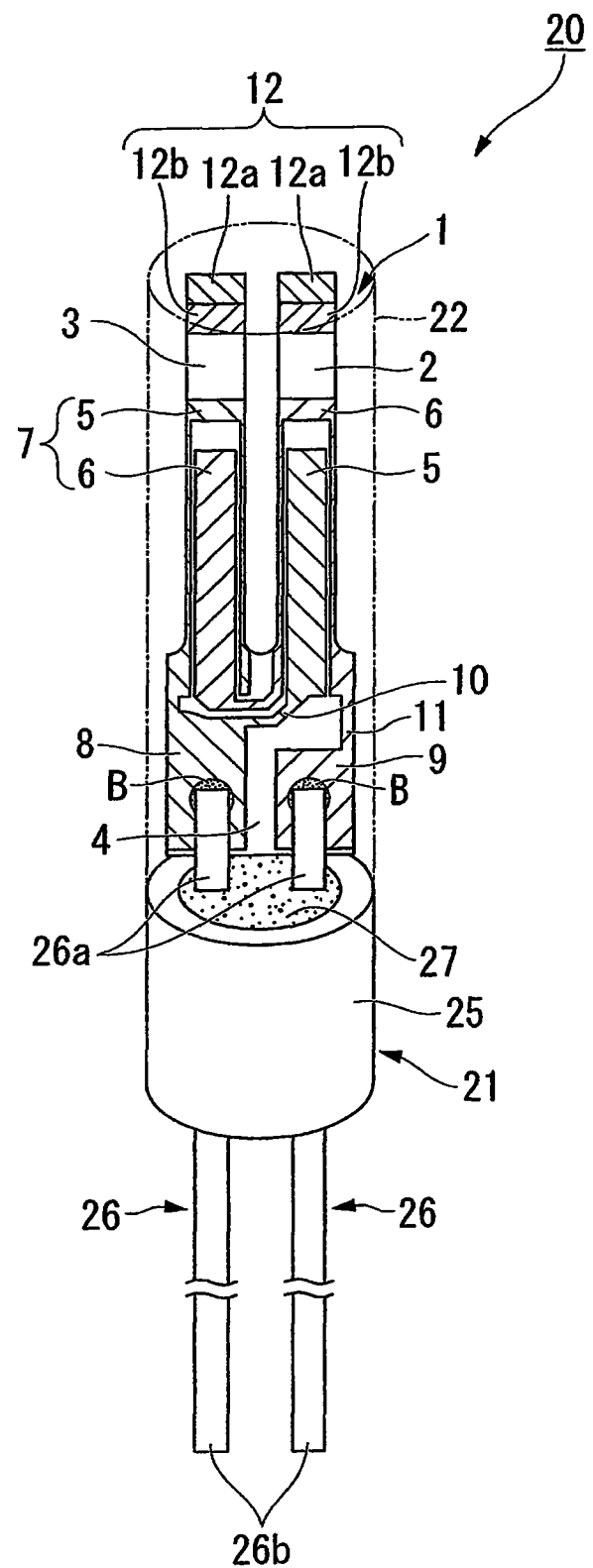
FIG. 16 is a view showing an embodiment of a piezoelectric vibrator of a cylinder shape package type having the piezoelectric vibrating piece according to the invention.

As shown by FIG. 16, a piezoelectric vibrator 20 of the embodiment includes the piezoelectric vibrating piece 1, an airtight terminal 21, and a case 22 bonded to the airtight terminal 21 in a state of sealing the piezoelectric vibrating piece 1 at inside thereof.

The airtight terminal 21 is constituted by a stem 25 in a ring-like shape, two pieces of lead terminals 26 arranged to penetrate the stem 25 and respectively connected electrically and mechanically to the two mount electrodes 8, 9 of the piezoelectric vibrating piece 1 by way of bumps B, and a filling member 27 integrally fixing the lead terminals 26 and the stem 25 in an insulating state and hermetically sealing inside of the case 22.

The stem 25 is formed in a ring-like shape by a metal material (for example, low carbon steel (Fe), iron nickel alloy (Fe—Ni), iron nickel cobalt alloy (Fe—Ni—Co)). Further, an outer periphery of the stem 25 is coated with a metal film, not illustrated, of tin copper alloy, gold tin alloy or the like. Further, a material of the filling member 27 is, for example, borosilicate glass. Further, portions of two pieces of the lead terminals 26 projected to inside of the case 22 constitute inner leads 26*a* and portions thereof projected to outside of the case 22 constitute outer leads 26*b*. Further, the outer lead 26*b* is made to function as an outer portion connection terminal.

The case 22 is press-fit to the outer periphery of the stem 25 and is fitted to be fixed thereto. Specifically, the case 22 and the stem 25 are fixed by cold pressure welding by interposing the metal film coated to the outer periphery of the stem 25. The case 22 is press-fit under a vacuum atmosphere, and therefore, a space surrounding the piezoelectric vibrating piece 1 at inside of the case 22 is hermetically sealed in a state of being maintained in vacuum.

According to the piezoelectric vibrator 20 of the cylinder package type constituted in this way, the piezoelectric vibrating piece 1 brought into low cost formation and high quality formation is provided, and therefore, low cost formation and high performance formation can similarly be achieved also for the piezoelectric vibrator 20 per se. Particularly, inside of the case 22 can be brought into a vacuum state, and therefore, an efficiency of vibrating the pair of vibrating arm portions 2, 3 can be promoted.

Figure 17:
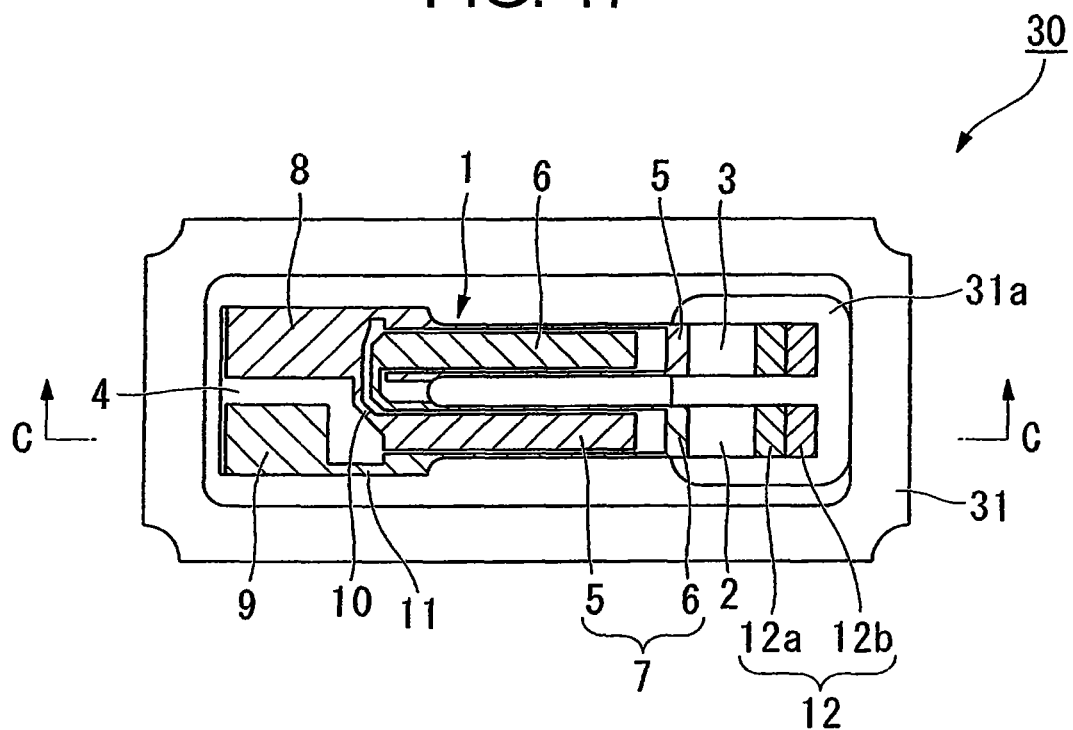
FIG. 17 is a sectional view showing an embodiment of a piezoelectric vibrator of a ceramic package type having the piezoelectric vibrating piece according to the invention.
Figure 18:
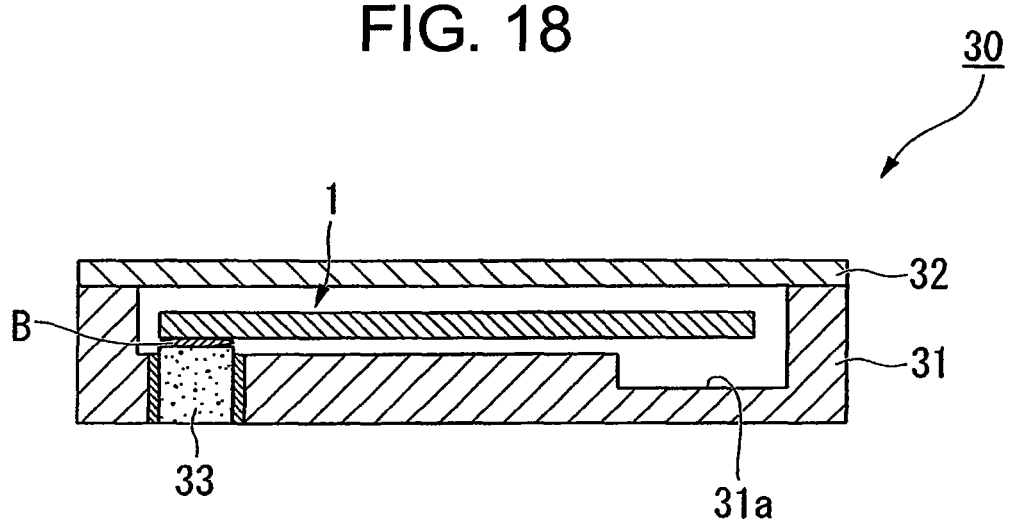
FIG. 18 is a sectional view taken along a cut line C-C shown in FIG. 17.

Although an explanation has been given by taking an example of the piezoelectric vibrator 20 of the cylinder package type as an example of the piezoelectric vibrator, the invention is not limited to the piezoelectric vibrator 20. For example, as shown by FIG. 17 and FIG. 18, a piezoelectric vibrator of a ceramic package type will do.

The piezoelectric vibrator 30 includes a base board 31 formed with a recess portion 31*a* at inside thereof, the piezoelectric vibrating piece 1 contained at inside of the recess portion 31*a* of the base board 31, and a lid board 32 fixed to the base board 31 in a state of containing the piezoelectric vibrating piece 1.

The base board 31 is arranged with a lead 33 having a hermetic seal structure, and a front end thereof is provided with a bump B. Further, the bump B and the mount electrodes 8, 9 of the piezoelectric vibrating piece 1 are mechanically and electrically connected. Further, the lead 33 is exposed to a bottom face of the base board 31. That is, the lead 33 is made to function as an external portion connecting terminal one end side of which is connected electrically to outside and other end side of which is electrically connected to the mount electrodes 8, 9.

Further, the base board 31 is sealed in airtight in vacuum by using various means of electron beam welding in vacuum, vacuum seam welding, or bonding by low melting point glass or eutectic metal and the like. Thereby, the piezoelectric vibrating piece 1 is sealed in airtight at inside thereof.

Even the piezoelectric vibrator 30 constituted in this way can achieve low cost formation and high performance formation similarly. Particularly, the space surrounded by the base board 31 and the lid board 32 can be brought into a vacuum state, and therefore, the efficiency of vibrating the pair of vibrating arm portions 2, 3 can similarly be promoted.

Next, an embodiment of an oscillator according to the invention will be explained in reference to FIG. 19.

Figure 19:
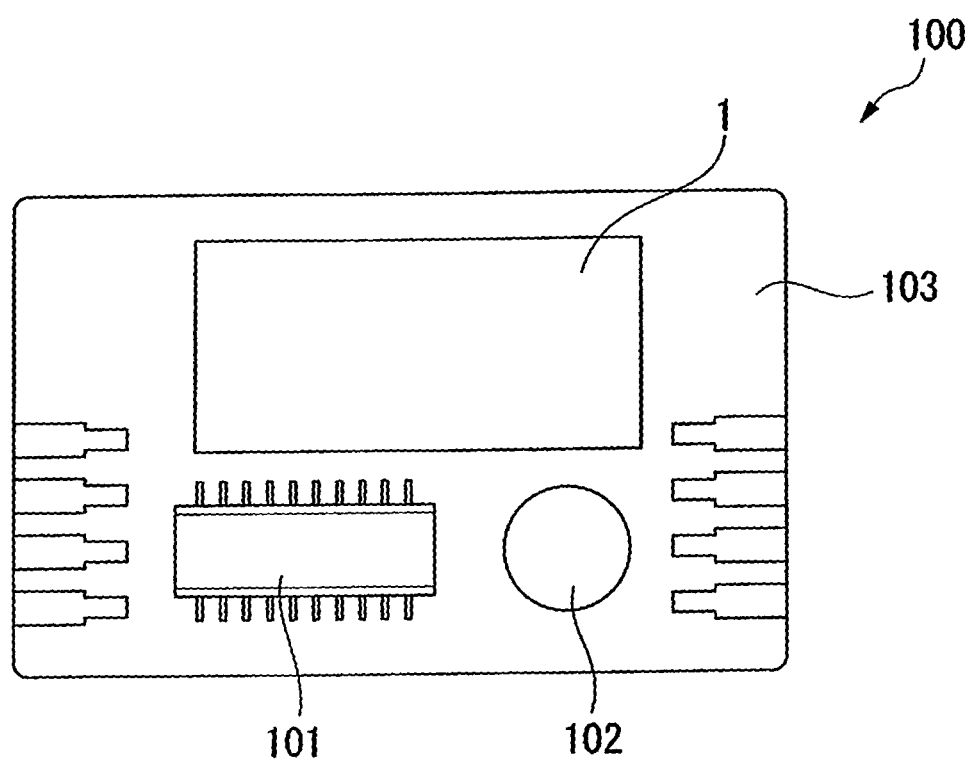
FIG. 19 is a constitution view showing an embodiment of an oscillator according to the invention.

As shown by FIG. 19, an oscillator 100 of the embodiment is constituted as an oscillator connecting the piezoelectric vibrator 20 to an integrated circuit 101. The oscillator 100 includes a board 103 mounted with an electronic part 102 of a capacitor or the like. The board 103 is mounted with the integrated circuit 101 for the oscillator, and mounted with the piezoelectric vibrating piece 1 of the piezoelectric vibrator 20 at a vicinity of the integrated circuit 101. The electronic part 102, the integrated circuit 101 and the piezoelectric vibrator 20 are electrically connected respectively by a wiring pattern, not illustrated. Further, respective constituent parts are molded by a resin, not illustrated.

In the oscillator 100 constituted in this way, when a voltage is applied to the piezoelectric vibrator 20, the piezoelectric vibrating piece 1 at inside of the piezoelectric vibrator 20 is vibrated. The vibration is converted into an electric signal by a piezoelectric characteristic provided to the piezoelectric vibrating piece 1 and is inputted to the integrated circuit 101 as an electric signal. The inputted electric signal is variously processed by the integrated circuit 101 and outputted as a frequency signal. Thereby, the piezoelectric vibrator 20 is made to function as an oscillator.

Further, the constitution of the integrated circuit 101 can be added with a function of controlling day or time of operating the apparatus or an external apparatus or providing time, a calendar or the like other than a single-function oscillator for a timepiece or the like by selectively setting RTC (real time clock) module or the like in accordance with a request.

As described above, according to the oscillator 100 of the embodiment, the piezoelectric vibrator 20 brought into low cost formation and high quality formation is provided, and therefore, low cost formation and high quality formation can similarly be achieved also for the oscillator 100 per se. Further, in addition thereto, a high accuracy frequency signal which is stable over a long period of time can be provided. Next, an embodiment of an electronic apparatus according to the invention will be explained in reference to FIG. 20. Further, an explanation will be given of an electronic apparatus by taking an example of a portable information apparatus 110 having the above-described piezoelectric vibrator 20. First, the portable information apparatus 110 of the embodiment is represented by, for example, a portable telephone, and a wristwatch in a background art is developed and improved. An outlook thereof is similar to a wristwatch, a liquid crystal display is arranged at a portion in correspondence with a dial, and current time or the like can be displayed on a screen thereof. Further, when utilized as a communicating machine, the portable information apparatus 110 is detached from the wrist and a communication similar to that of the portable telephone of the background art can be carried out by a speaker and a microphone included at an inner side portion of a strap. However, in comparison with the portable telephone of the background art, the portable information apparatus 110 is remarkably small-sized and light-weighted.

Figure 20:
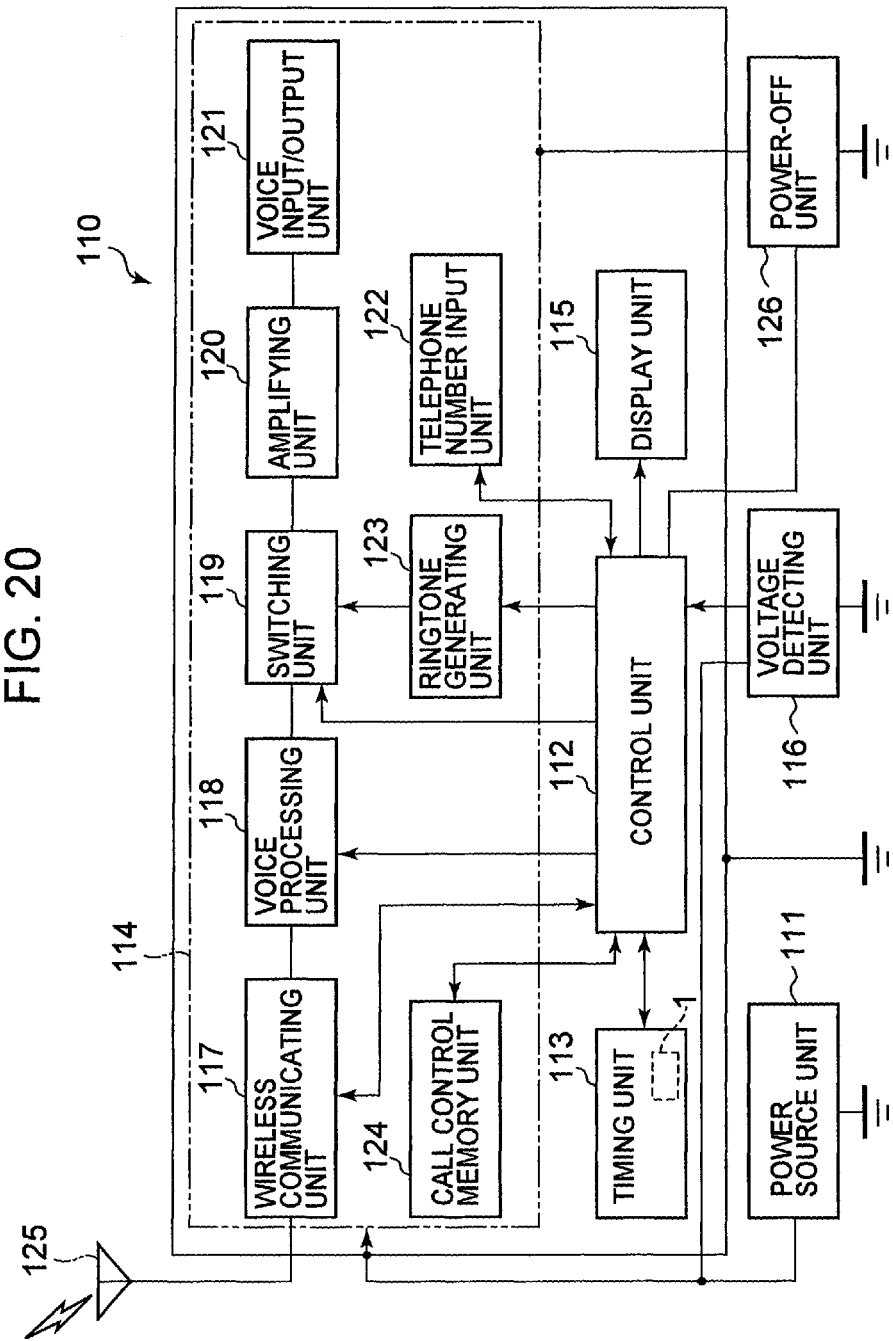
FIG. 20 is a constitution diagram showing an embodiment of an electronic apparatus according to the invention.

Next, a constitution of the portable information apparatus 110 of the embodiment will be explained. As shown by FIG. 20, the portable information apparatus 110 includes the piezoelectric vibrator 20 and a power source portion 111 for supplying a power. The power source portion 111 is constituted by, for example, a lithium secondary cell. The power source portion 111 is connected in parallel with a control portion 112 for carrying out various controls, a time counting portion 113 for counting time, a communicating portion 114 for carrying out a communication with outside, a display portion 115 for displaying various information, and a voltage detecting portion 116 for detecting voltages of respective function portions. Further, the respective function portions are supplied with the power by the power source portion 111.

The control portion 112 carries out a control of an operation of a total of a system of transmitting and receiving voice data, measuring and displaying current time by controlling the respective function portions. Further, the control portion 112 includes ROM previously written with programs, CPU reading to execute the program written to the ROM, and RAM or the like used as a work area of the CPU.

The time counting portion 113 includes an integrating circuit including an oscillating circuit, a register circuit, a counter circuit and an interface circuit or the like, and the piezoelectric vibrator 20. When a voltage is applied to the piezoelectric vibrator 20, the piezoelectric vibrating piece 1 is vibrated, and the vibration is converted into an electric signal by a piezoelectric characteristic provided to quartz and is inputted to an oscillating circuit as the electric signal. An output of the oscillating circuit is binarized and is counted by the register circuit and the counter circuit. Further, a signal is transmitted to and received from the control portion 112 by way of an interface circuit, and current time or current date or calendar information or the like is displayed at the display portion 115.

The communicating portion 114 is provided with a function similar to that of the portable telephone of the background art, and includes a wireless portion 117, a voice processing portion 118, a switching portion 119, an amplifying portion 120, a voice inputting and outputting portion 121, a telephone number inputting portion 122, an arrival sound generating portion 123 and a call control memory portion 124.

The wireless portion 117 exchanges to transmit and receive various data of voice data or the like to and from a base station by way of an antenna 125. The voice processing portion 118 codes and decodes a voice signal inputted from the wireless portion 117 or the amplifying portion 120. The amplifying portion 120 amplifies a signal inputted from the voice processing portion 118 or the voice inputting and outputting portion 121 to a predetermined level. The voice inputting and outputting portion 121 is constituted by a speaker, a microphone and the like for making the arrival sound or the received voice loud or collecting voice.

Further, the arrival sound generating portion 123 generates an arrival sound in accordance with a call of a base station. The switching portion 119 switches the amplifying portion 120 connected to the voice processing portion 118 to the arrival sound generating portion 123 only in arrival of signal, thereby, the arrival sound generated at the arrival sound generating portion 123 is outputted to the voice inputting and outputting portion 121 by way of the amplifying portion 120.

Further, the call control memory portion 124 is stored with a program related to emitting and arrival call control of communication. Further, the call control memory portion 124 includes, for example, number keys of 0 through 9 and other key and by depressing the number leys and the like, a telephone number of a speech destination or the like is inputted.

When a voltage applied to the respective function portions of the control portion 112 or the like by the power source portion 111 becomes lower than a predetermined value, the voltage detecting portion 116 detects the voltage drop to inform to the control portion 112. The predetermined voltage value at this occasion is a value previously set as a minimum voltage necessary for stably operating the communicating portion 114 and becomes, for example, about 3V. The control portion 112 informed with the voltage drop from the voltage detect portion 116 prohibits operations of the wireless portion 117, the voice processing portion 118, the switching portion 119 and the arrival sound generating portion 123. Particularly, stopping of the operation of the wireless portion 117 having a large power consumption becomes indispensable. Further, a statement that the communicating portion 114 cannot be used by a deficiency in a remaining amount of the battery is displayed on the display portion 115.

That is, by the voltage detecting portion 116 and the control portion 112, the operation of the communicating portion 114 can be prohibited and the statement can be displayed on the display portion 115. Although the display may be constituted by a character message, a x (check) mark may be attached to a telephone icon displayed at an upper portion of a display face of the display portion 115 as a further intuitive display.

Further, by providing a power source cutting portion 126 capable of selectively cutting the power source of a portion related to the function of the communicating portion 114, the function of the communicating portion 114 can further firmly be stopped.

As described above, according to the portable information apparatus 110 of the embodiment, the piezoelectric vibrator 20 brought into low cost formation and high quality formation is provided, and therefore, low cost formation and high quality formation can similarly be achieved also in the portable information apparatus 110 per se. Further, in addition thereto, high accuracy timepiece information stable over a long period of time can be displayed.

Next, an embodiment of a radiowave timepiece according to the invention will be explained in reference to FIG. 21.

Figure 21:
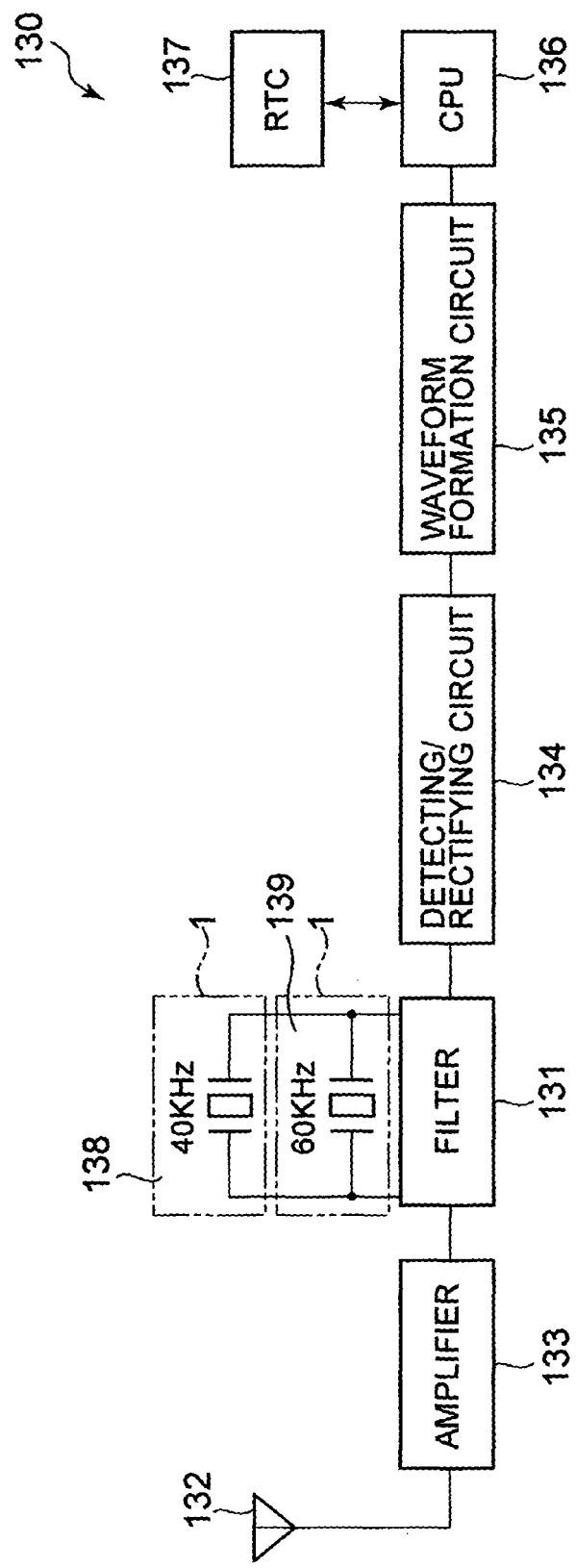
FIG. 21 is a constitution diagram showing an embodiment of a radiowave timepiece according to the invention.
Figure 22:
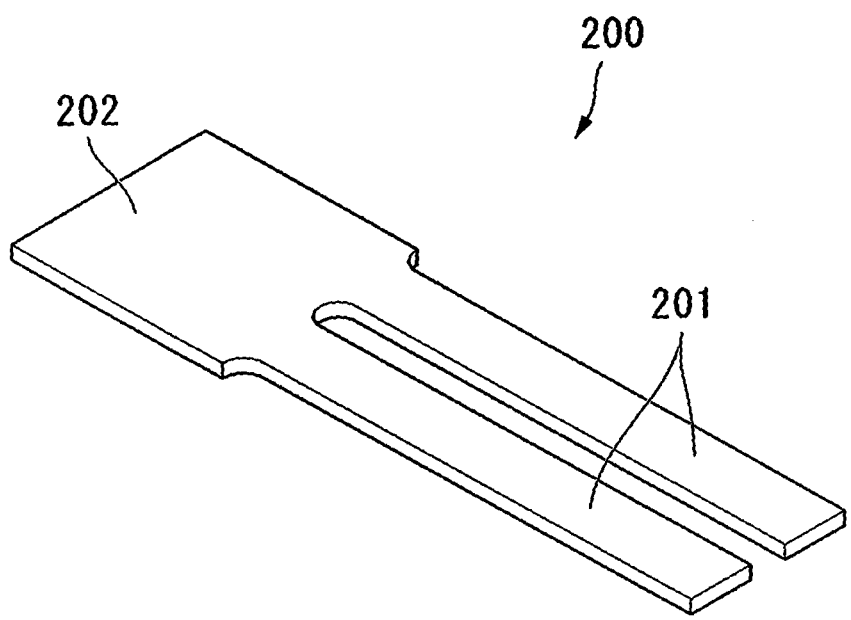
FIG. 22 is a perspective view showing a piezoelectric vibrating piece of a tuning fork type of a background art.
Figure 23:
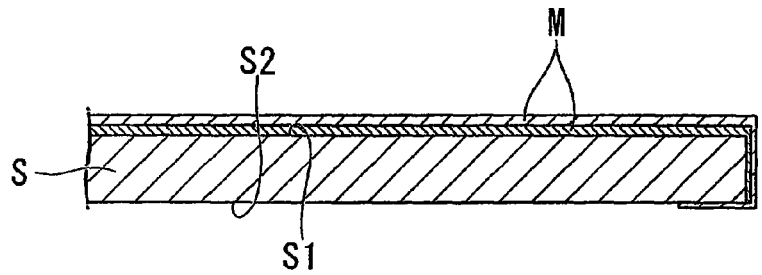
FIG. 23 is one step view in fabricating the piezoelectric vibrating piece shown in FIG. 22 and is a view showing a state of forming a metal film on one face of a wafer.
Figure 24:
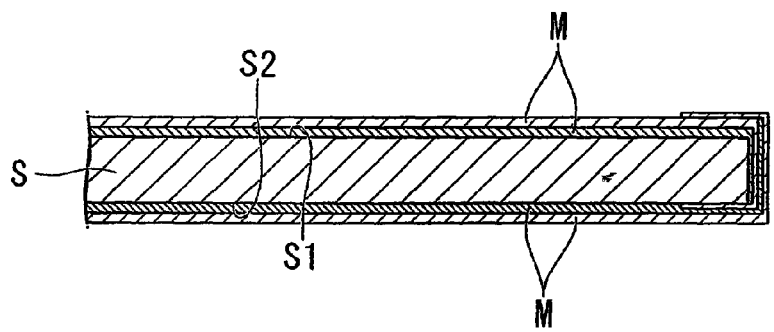
FIG. 24 is a view showing a state of forming a metal film on other face of the wafer from the state shown in FIG. 23.
Figure 25:
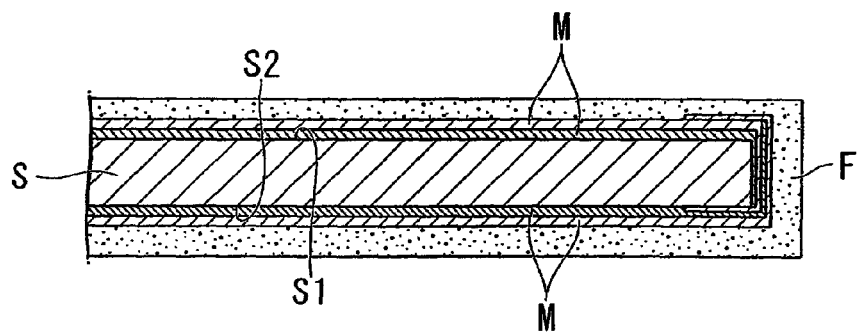
FIG. 25 is a view showing a state of coating a photoresist film on a total thereof from a state shown in FIG. 24.
Figure 26:
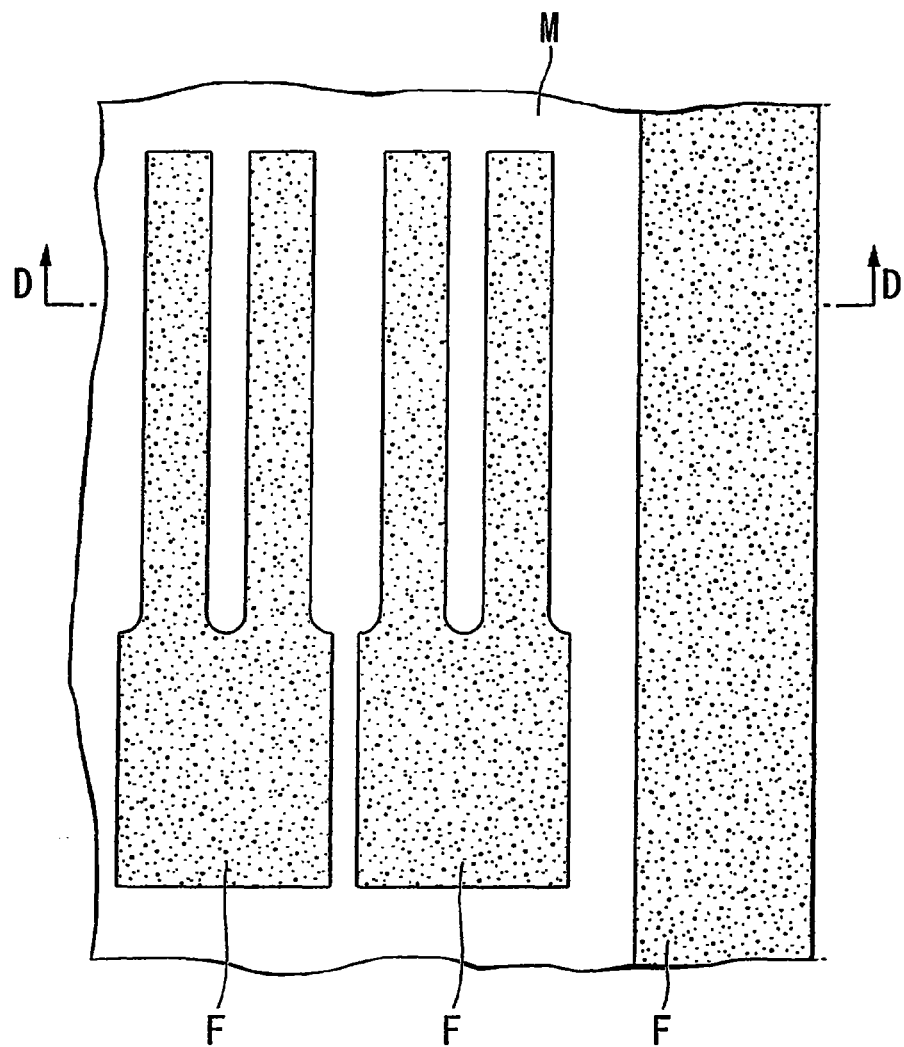
FIG. 26 is a view showing the state of patterning a photoresist film from the state shown in FIG. 25.
Figure 27:
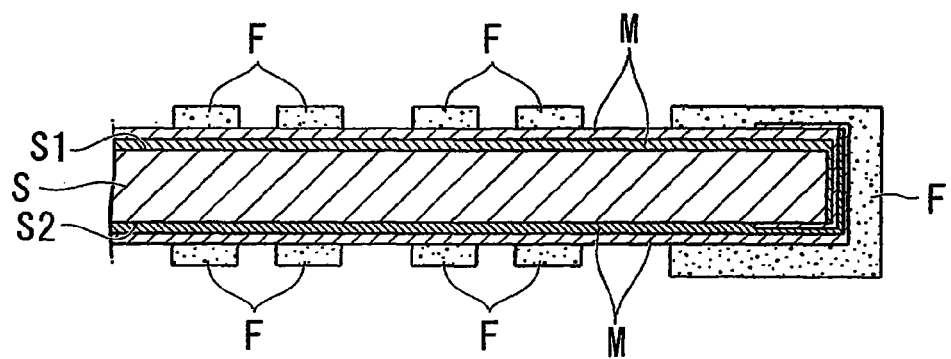
FIG. 27 is a sectional view taken along a cut line D-D shown in FIG. 26.
Figure 28:
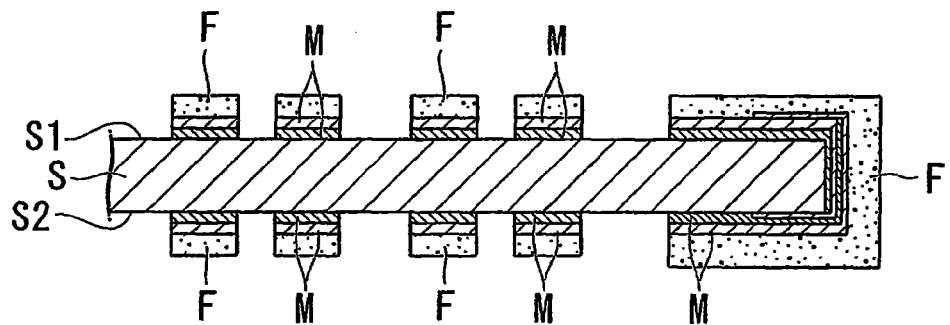
FIG. 28 is a view showing a state of patterning a metal film by constituting a mask by the photoresist film from the state shown in FIG. 27.
Figure 29:
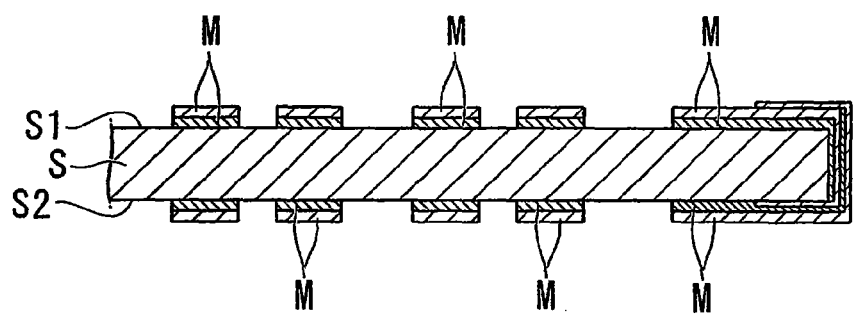
FIG. 29 is a view showing a state of removing the photoresist film from the state shown in FIG. 28.
Figure 30:
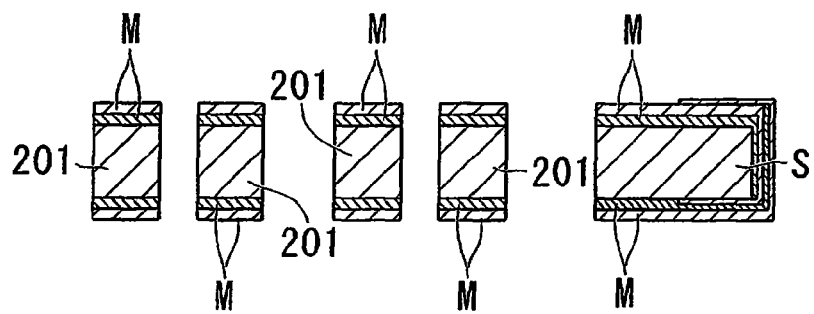
FIG. 30 is a view showing a state of working the wafer by etching by constituting a mask by the metal film from the state shown in FIG. 29.

As shown by FIG. 21, a radiowave timepiece 130 of the embodiment includes the piezoelectric vibrator 20 electrically connected to a filter portion 131, and is a timepiece provided with a function of receiving a standard radiowave including timepiece information and automatically correcting time to accurate time to display.

In Japan, there are transmission places (transmission stations) for transmitting the standard radiowave at Fukushima prefecture (40 kHz) and Saga prefecture (60 kHz), and the standard radiowave is transmitted respectively therefrom. A long wave of 40 kHz or 60 kHz is provided with both of a property of propagating on the ground surface and a property of propagating while being reflected by the ionosphere and the ground surface, and therefore, a propagating range is wide and all of Japan is covered by the two transmission stations. A function constitution of the radiowave timepiece 130 will be explained in details as follows.

An antenna 132 receives the standard radiowave of the long wave of 40 kHz or 60 kHz. The standard radiowave of the long wave subjects time information referred to as time code to AM modulation to a carrier wave of 40 kHz or 60 kHz. The received standard radiowave of the long wave is amplified by an amplifier 133, and filtered and tuned by the filter portion 131 having a plurality of the piezoelectric vibrators 20. The piezoelectric vibrator 20 according to the embodiment is respectively provided with quartz vibrator portions 138, 139 having resonance frequencies of 40 kHz and 60 kHz the same as the carrier frequencies.

Further, the filtered signal of the predetermined frequency is detected and decoded by a detecting, rectifying circuit 134. Successively, the time code is taken out by way of a waveform shaping circuit 135 and is counted by CPU 136. CPU 136 reads information of current year, accumulated date, day of week, time or the like. The read information is reflected to RTC 137 and accurate time information is displayed.

The carrier wave is provided with 40 kHz or 60 kHz, and therefore, the vibrator having the structure of the tuning fork type mentioned above is preferable for the quartz vibrator portions 138, 139.

Further, although the above-described explanation has been shown by the example of Japan, the frequency of the standard wave of the long wave differs overseas. For example, in Germany, a standard radiowave of 77.5 kHz is used. Therefore, when the radiowave timepiece 130 capable of dealing with also overseas is integrated to a portable apparatus, a piezoelectric vibrator of a frequency different from that in the case of Japan is needed.

As described above, according to the radiowave timepiece 130 of the embodiment, the piezoelectric vibrator 20 brought into low cost formation and high quality formation is provided, and therefore, low cost formation and high quality formation can be achieved similarly for the radiowave timepiece per se. Further, in addition thereto, time can be counted stably and highly accurately over a long period of time.

Further, the technical range of the invention is not limited to the above-described embodiment but can variously be modified within the range not deviated from the gist of the invention.

For example, although according to the embodiment, as an example of the piezoelectric vibrating piece, an explanation is given by taking the example of the piezoelectric vibrating piece of the tuning fork type, the embodiment is not limited to the tuning fork type. For example, a thickness slipping vibrating piece will do.

What is claimed is:

1. A method of fabricating a plurality of piezoelectric vibrating pieces from wafer, the method comprising:
   a film forming step of forming metal films respectively on both faces of the wafer, wherein the film forming step comprises forming a metal film overlap region where a number of layers of the metal films overlaps around a side face of the wafer and extending inwardly from an outer peripheral end of the wafer while forming the metal films on both faces of the water;
   a patterning step of removing the metal film overlap region by a constant distance inwardly from the outer peripheral end over an entire periphery thereof which encompasses the side face of the wafer, and thereafter, patterning the remaining metal film to an outer shape of the plurality of piezoelectric vibrating pieces;
   an outer shape forming step of forming outer shapes of the plurality of piezoelectric vibrating pieces at the wafer a size of which is reduced by an amount of the constant distance by selectively removing the wafer by wet etching by using as a mask, the remaining the patterned metal film; and
   a removing step of removing the remaining patterned metal film.

2. The method of fabricating a piezoelectric vibrating piece according to claim 1, wherein the constant distance is set to a distance in a range equal to or larger than 0.3 mm and equal to or smaller than 0.5 mm.

* * * * *

UNITED STATES PATENT AND TRADEMARK OFFICE
CERTIFICATE OF CORRECTION

| | | |
|---|---|---|
| PATENT NO. | : 8,898,874 B2 | Page 1 of 1 |
| APPLICATION NO. | : 12/372251 | |
| DATED | : December 2, 2014 | |
| INVENTOR(S) | : Mitsuo Tomiyama et al. | |

It is certified that error appears in the above-identified patent and that said Letters Patent is hereby corrected as shown below:

<u>In the Claims</u>

In column 14, claim 1, line 38, after "a mask, the remaining" delete "the".

Signed and Sealed this
Thirteenth Day of October, 2015

Michelle K. Lee
*Director of the United States Patent and Trademark Office*